(12) United States Patent
Magni et al.

(10) Patent No.: US 9,324,627 B2
(45) Date of Patent: Apr. 26, 2016

(54) ELECTRONIC ASSEMBLY FOR MOUNTING ON ELECTRONIC BOARD

(71) Applicant: STMicroelectronics S.r.l., Agrate Brianza (IT)

(72) Inventors: Pierangelo Magni, Villasanta (IT); Giuseppe Gattavari, Busto Arsizio (IT); Mark Andrew Shaw, Milan (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 14/258,818

(22) Filed: Apr. 22, 2014

(65) Prior Publication Data

US 2014/0312484 A1 Oct. 23, 2014

(30) Foreign Application Priority Data

Apr. 22, 2013 (IT) .............................. MI2013A0654

(51) Int. Cl.
*H01L 23/02* (2006.01)
*H01L 23/34* (2006.01)
(Continued)

(52) U.S. Cl.
CPC .......... *H01L 23/34* (2013.01); *H01L 23/49541* (2013.01); *H01L 24/80* (2013.01);
(Continued)

(58) Field of Classification Search
CPC .............. H01L 23/49827; H01L 23/36; H01L 23/3672; H01L 23/3677; H01L 23/34; H01L 23/3107; H01L 24/80; H01L 2224/48248; H01L 2224/48091; H01L 2924/00; H01L 2924/181; H05K 1/183; H05K 3/306
USPC ......... 257/675, 707, 722, 276, 625, 698, 706, 257/711, 720, 796, 678, E33.058, E23.067, 257/E23.103, E23.104, E23.105, E23.128; 438/122, 106
See application file for complete search history.

(56) References Cited

U.S. PATENT DOCUMENTS 6,967,395 B1 11/2005 Glenn et al.
2002/0100963 A1 8/2002 Suzuki et al.
(Continued)

FOREIGN PATENT DOCUMENTS

WO WO2008091474 7/2008

OTHER PUBLICATIONS

Search Report for Italian patent application No. MI20130654; The Hague, Holland; Jan. 24, 2014, 2 pages.

*Primary Examiner* — Jasmine Clark
(74) *Attorney, Agent, or Firm* — Seed IP Law Group PLLC

(57) ABSTRACT

An embodiment of an electronic assembly for mounting on an electronic board includes a plurality of electric contact regions exposed on a mounting surface of the electronic board. The electronic assembly includes a chip of semiconductor material in which at least one electronic component is integrated, at least one support element including a first main surface and a second main surface opposite to the first main surface, the chip being enclosed by the at least one support element, a heat dissipation plate thermally coupled to said chip to dissipate the heat produced by it, exposed on the first main surface of the support element, a plurality of contact elements, each electrically coupled to a respective electric terminal of the electronic component integrated in the chip, exposed on the same first main surface of which is exposed to the dissipation plate. Also included are a plurality of electric connection elements, each adapted to electrically intercouple a respective contact element of the electronic assembly with a corresponding electric contact region of the electronic board, in such a way that the second main surface of the at least one support element faces the mounting surface of the electronic board.

18 Claims, 7 Drawing Sheets

(51) Int. Cl.
 H01L 23/00 (2006.01)
 H01L 23/495 (2006.01)
 *H01L 23/31* (2006.01)
 *H05K 1/18* (2006.01)
 *H05K 3/30* (2006.01)

(52) U.S. Cl.
 CPC ... *H01L23/3107* (2013.01); *H01L 2224/48091* (2013.01); *H01L 2224/48247* (2013.01); *H01L 2924/12042* (2013.01); *H01L 2924/181* (2013.01); *H05K 1/183* (2013.01); *H05K 3/306* (2013.01)

(56) References Cited

U.S. PATENT DOCUMENTS

2003/0189246 A1* 10/2003 Iwaki et al. .................. 257/706
2012/0217629 A1* 8/2012 Cho et al. .................... 257/692

* cited by examiner

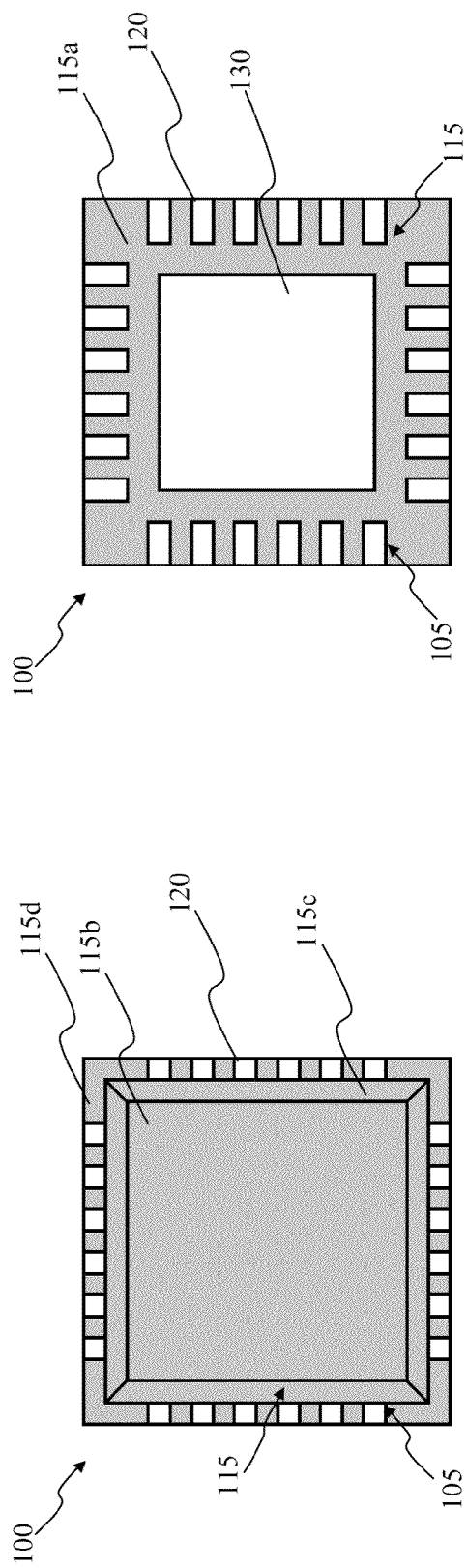
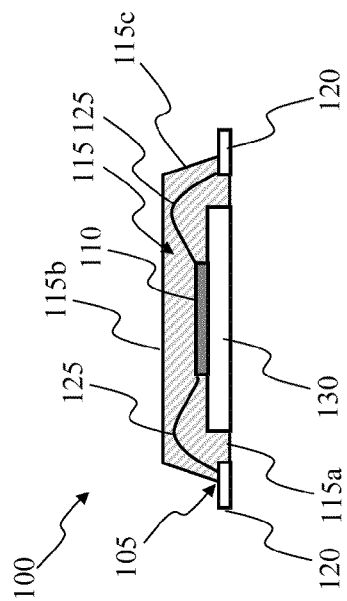
FIG.1A
FIG.1B
FIG.1C

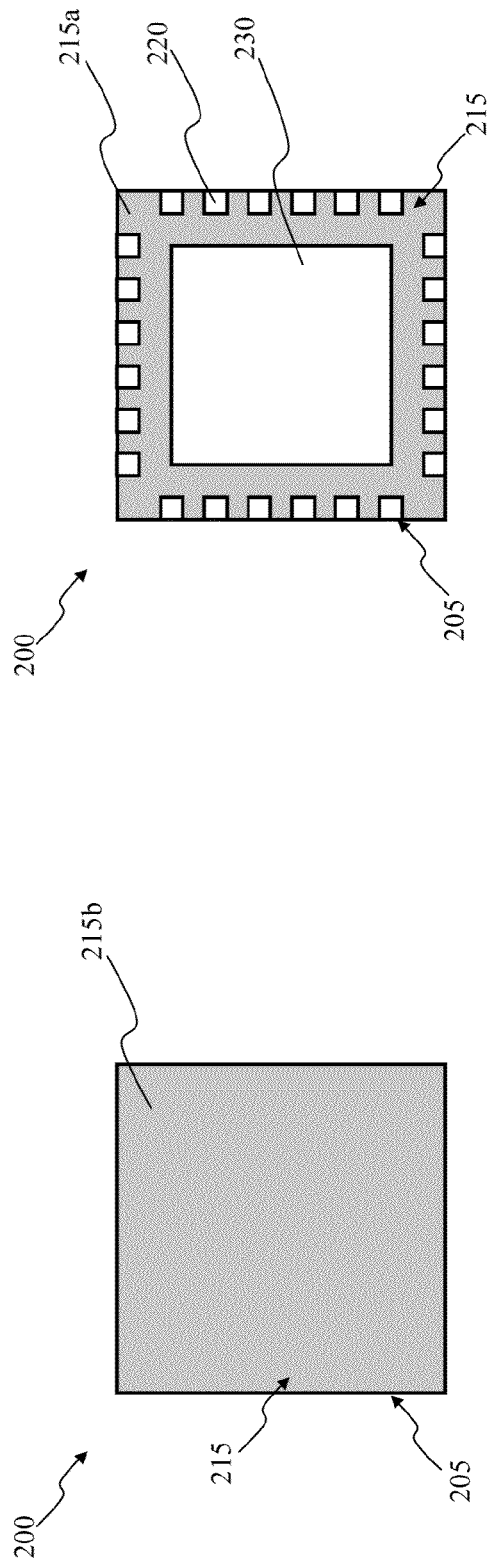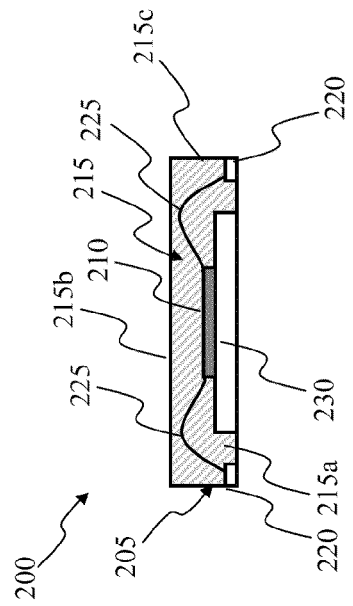

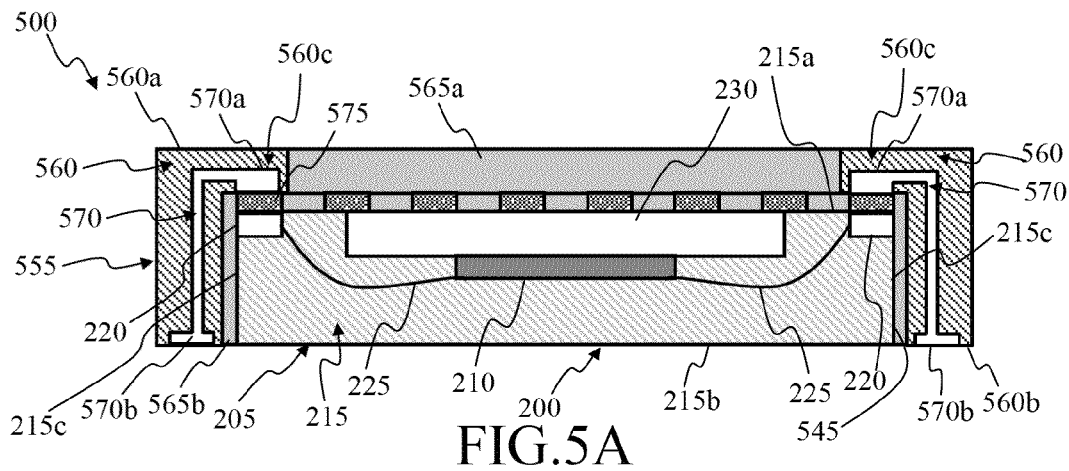
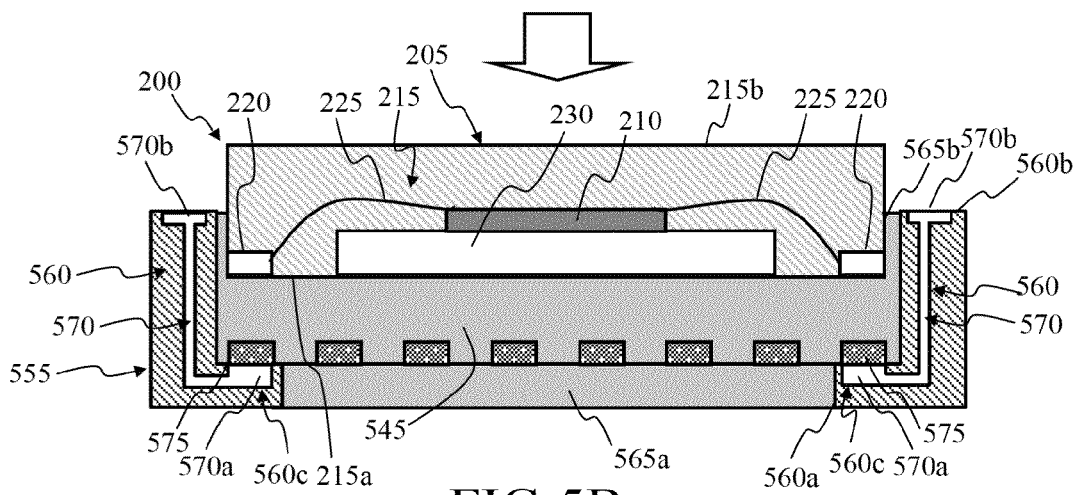
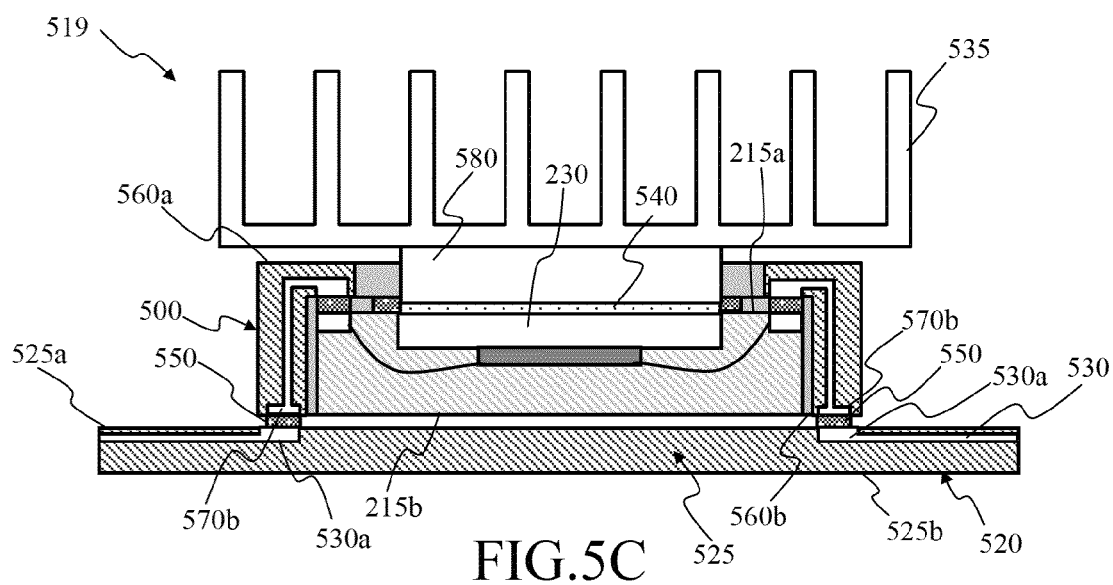

ELECTRONIC ASSEMBLY FOR MOUNTING ON ELECTRONIC BOARD

PRIORITY CLAIM

The instant application claims priority to Italian Patent Application No. MI2013A000654, filed 22 Apr. 2013, which application is incorporated herein by reference in its entirety.

TECHNICAL FIELD

An embodiment of the present invention generally relates to semiconductor devices. In greater detail, such embodiment relates to an electronic assembly comprising one or more electronic devices.

SUMMARY

In the field of electronics there is a general trend in reducing the physical size of the electronic devices (known as miniaturization or scaling) both from the point of view of chips used—increasing the amount of components that can be integrated per unit volume of the chip—both from the point of view of the packages in which are inserted the chips (for insulation and protection from the external environment). For example, packages of a flat type have a wide diffusion due to their compact structure—which typically includes a casing of electrically insulating material, usually quadrangular, with very small size—thanks to which it is possible to obtain electronic circuits even of considerable complexity, in a reduced volume. Such small size is particularly sought after in products of the portable type (personal computers, tablets, smartphones, etc.), for which a small footprint, low thickness, and low weight are key features.

Among electronic devices with a flat casing (package), the no-lead type allows an even more compact design. In the no-leads package type, the classic "gull wing" leads are replaced by the contact elements exposed from a (main) surface of the casing of the assembly. These contact elements may extend beyond a perimeter (in plan view) of the casing—in which case the package is defined punched and the casing usually has a trapezoidal cross-section—or stop substantially flush with the perimeter of the casing—in this case the package is defined sawn and the casing usually has a rectangular cross section. The contact elements can be distributed along two or more sides of the bottom surface of the casing and determine the name of the package. For example, particularly common (because of the large number of contact elements available) are packages with contacts on each of the four sides of the casing, which are identified as QFN (Quad Flat No leads, where Quad precisely indicates the arrangement of contacts on all the four sides).

The high level of miniaturization involves a very localized heat generation in the chip during the use of the electronic device; for dissipation of this heat, many packages include a dissipation plate (Exposed Pad), in metal for example, copper, thermally coupled to the chip within the casing and exposed on the same main surface on which the contacts are exposed. Usually, the dissipation plate is coupled (e.g., welded) to a corresponding dissipation plate on a mounting surface of an electronic support (such as a PCB—Printed Circuit Board), which can be thermally coupled (e.g., via metallic through holes or "vias" formed in the PCB) to a heat sink element (e.g., a copper layer) formed (increasing the cost and weight of the electronic circuit, as well as reducing the space available for making cross-electrical connections or making impossible the making of such connections) on a surface or in intermediate layers of the electronic support opposite to the mounting surface (thereby reducing a space available for mounting other electronic devices on the electronic support).

It has observed that the heat exchange between the electronic device and the heat sink (on PCB) may not be sufficiently high to allow the electronic device to operate in a range of its optimal temperatures. A heat sink mounted on a (main) free surface opposite to the mounting surface thereof also turns out to have limited efficacy since the insulating material of the casing generally has a limited capacity of thermal exchange. Therefore, electronic devices, in particular power electronic devices, which operate with rather high voltages and currents (in the order of tens/hundreds of volts and tens of amperes), can reach operating temperatures external to (in particular, higher than) the range of optimal operating temperatures with a consequent reduction in performance and operating life of the electronic device.

An embodiment has been developed suitable to ensure an improved thermal dissipation of the electronic device, while maintaining compact an implementation of an electronic circuit in which such electronic device is employed. Particularly, an embodiment can be advantageously applied to electronic devices of the "no-lead" type.

In general terms, an embodiment is based on the idea of providing an electronic assembly including at least one electronic device adapted to allow a mounting of an electronic board with free contact elements and dissipation plate; i.e., with a main surface, on which the dissipation plate and the contact elements are exposed, facing towards the external environment and opposite to a mounting surface of the electronic board.

More specifically, an embodiment is an electronic assembly for mounting on an electronic board. The electronic board includes a plurality of electric contact regions exposed on a mounting surface of the electronic board. The electronic assembly includes a chip in semiconductor material in which is integrated at least one electronic component, and at least one support element. The support element includes a first main surface and a second main surface opposite to the first main surface, the chip being enclosed by the at least one support element. Moreover, the electronic assembly includes a heat-dissipation plate thermally coupled to said chip to dissipate the heat produced by it, exposed on the first main surface of the support element, and a plurality of contact elements, each electrically coupled to a respective electric terminal of the electronic component integrated in the chip, exposed on the same first main surface on which is exposed the dissipation plate. In an embodiment, the electronic assembly further includes a plurality of electric-connection elements. Each electric-connection element is adapted to electrically intercouple a respective contact element of the electronic assembly with a corresponding electric contact region of the electronic board, in such a way that the second main surface of the at least one support element faces the mounting surface of the electronic board.

Another an embodiment is a corresponding method of assembling an electronic assembly.

Another an embodiment is an electronic circuit including at least one electronic assembly and an electronic board.

Another embodiment is the above-mentioned electronic circuit provided with a heat sink or a covering element attached to the dissipation plate.

BRIEF DESCRIPTION OF THE DRAWINGS

One or more embodiments, as well as additional features and advantages thereof, will be best understood by reference to the following detailed description, given purely by way of non-limiting example, to be read in conjunction with the accompanying figures (in which corresponding elements are indicated with the same or similar references and their explanation is not repeated for brevity). In this respect, it is expressly understood that the figures are not necessarily to scale (with some details that may be exaggerated or simplified) and that, unless otherwise indicated, they are simply used to conceptually illustrate the structures and procedures described. In particular:

FIGS. 1A-1C are schematic top and bottom plan views, and a cross section side view of a punched flat-type electronic device, according to an embodiment.

FIGS. 2A-2C are schematic top and bottom plan views, and a cross-section side view of a sawn flat-type electronic device, according to an embodiment.

FIG. 5A-5C are schematic cross-section side views of an electronic assembly including an electronic device of the sawn flat-type, of a phase of an assembling method thereof, and of a portion of the electronic circuit including it, respectively, according to an embodiment.

DETAILED DESCRIPTION

Figure 3A:
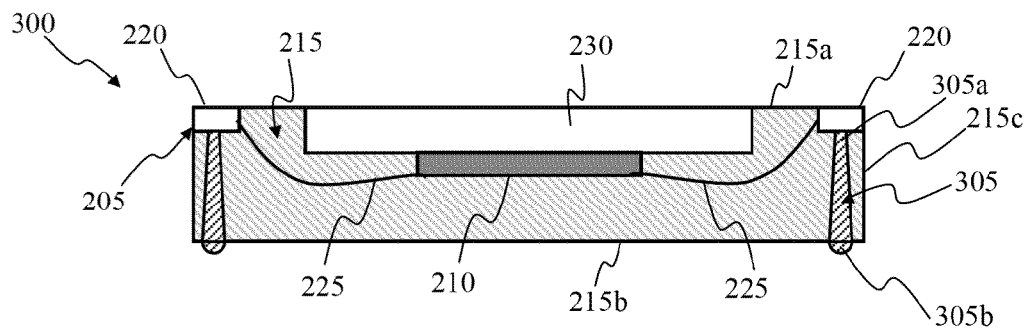
FIGS. 3A-3D are schematic cross-section side views of an electronic assembly including an electronic device of the sawn flat-type, of two phases of an assembling method thereof, and of a portion of the electronic circuit including it, respectively, according to an embodiment.

With reference to the figures, FIGS. 1A-1C are schematic in plan and in cross-section side views of an electronic device 100 with a package 105 of a punched flat-type with leads on four sides; for sake of simplicity, from now on the electronic device 100 will be called QFNp device.

The QFNp device 100 includes a chip 110 in semiconductor material in which is embedded one or more electronic components—for example, from a single diode to a complex integrated circuit such as a microprocessor. The chip 110 is electrically insulated and protected from the external environment by an insulating casing 115 (for example, made of a plastic polymer) of the package 105. In the example at issue, the insulating casing 115 has a shape substantially of a prism with a quadrangular base on which rests a truncated pyramid with a quadrangular base area smaller than the base of the prism (for example, with both bases squared and thus with a cross section substantially corresponding to a rectangle surmounted by a trapezoid) with a first (lower) main surface 115a having an extension greater than a second (upper) main surface 115b; such main surfaces 115a and 115b are opposed to each other and separated by four side surfaces 115c that extend from a third main surface 115d having an extension equal to the first main surface 115a and opposite to it. The four side surfaces 115c are substantially inclined with respect to a plane normal to the main surfaces 115a and 115b.

A flow of electric current between the electric terminals (not shown) of the chip 110 and external elements (for example, electric tracks of an electronic board or other electronic devices) to the QFNp device 100 is possible thanks to a plurality of contact elements 120 of the package 105 arranged, for example, regularly, along a perimeter of the first main surface 115a and the third main surface 115d. The contact elements 120 are, for example, blocks of substantially parallelepiped shape formed in a conducting material (such as copper) and are electrically coupled to the terminals/contact pads of the chip 110, for example through electric bonding wires 125 immersed in the insulating casing 115. In the case of the QFNp device 100 the contact elements 120 are formed in such a way as to be exposed on the first main surface 115a, on the third main surface 115d and on an edge region interposed between the main surfaces 115a and 115d (to simplify a mounting operation on an electronic board as known).

In order to dissipate the heat produced during operation by the electronic component integrated in the chip 105, the package 105 of the QFNp device 100 includes a heat-dissipation plate 130. In the example illustrated in the figures, the dissipation plate 130 has a substantially parallelepiped shape, for example, with a square base, in thermally conducting material (e.g., a metal such as copper or aluminium); the dissipation plate 130 is thermally coupled to the chip 110 (for example, through the use of a thermally conductive adhesive paste) via a contact surface, while a dissipation surface of dissipation plate 130 is facing the main surface 115a of the package 115 (for transferring heat from the chip 105 to the environment external to the QFNp device 100).

In contrast, FIGS. 2A-2C are schematic plan and cross-section side views of an electronic device 200 with a package 205 of the sawn flat-type with leads on four sides; for sake of simplicity, from now on the electronic device 200 will be referred to as a QFNs device.

The QFNs device 200 differs from QFNp device 100 in what follows. The insulating casing 215 has a shape substantially parallelepiped with a quadrangular base (for example squared, thus with a rectangular cross section) with a first (bottom) main surface 215a having the same extension of a second (upper) main surface 215b; such main surfaces 215a and 215b are opposed to each other and separated by four side surfaces 215c substantially perpendicular to the main surfaces 215a and 215b.

In this case, the contact elements 220, which ensure the electrical connections with external elements, are again blocks substantially parallelepiped shaped formed in conducting material (such as copper or aluminium), but are formed in such a way as to expose themselves on the side surfaces 215c without overstepping the perimeter of the first main surface 215a (in order to have a small footprint in plan view).

In an embodiment described below, there is provided an electronic assembly, including at least one QFNp device 100 or one QFNs device 200, adapted to be mounted on an electronic board or other similar electronic support in such a way as to leave free the first main surface 115a or 215a on which the dissipation plate 130 or 230 and the contact elements 120 or 220 are exposed. In other words, the electronic assembly enables to couple (both mechanically and electrically) the at least one QFNp device 100 or a QFNs device 200 to the electronic board, with the second main surface 115b or 215b facing the electronic board and the first main surface 115a or 215a opposite to it (thus directed towards the external environment).

Turning to FIG. 3A, it is a schematic cross-section side view of an electronic assembly 300 according to an embodiment, including a QFNs device 200.

The electronic assembly 300 includes substantially the QFNs device 200 and a plurality of (electric) connecting elements 305, each corresponding to a respective contact element of the plurality of contact elements 220. Each (electric) connection element 305 is formed in conducting material (for example, of a welding material) with a substantially cylindrical or frustoconical shape (although parallelepiped and other shapes are not excluded), which extends inside the insulating casing 215 with a (first) connection end 305a electrically coupled to a corresponding contact element 220 and with a (second) connection end 305b (opposite to the first one) that extends beyond (or at least faces) the second main surface 115b of the insulating casing 115, in such a way as to allow an electrical coupling with another electronic element (for example an electronic board, as described below).

Figure 3B:
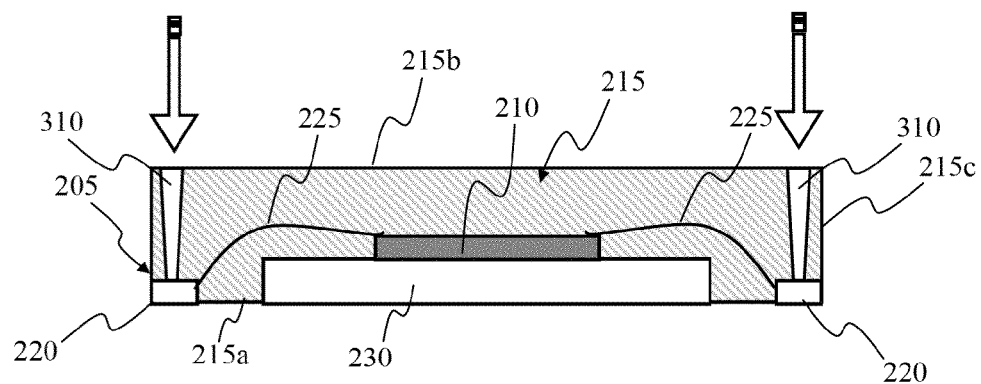
Figure 3C:
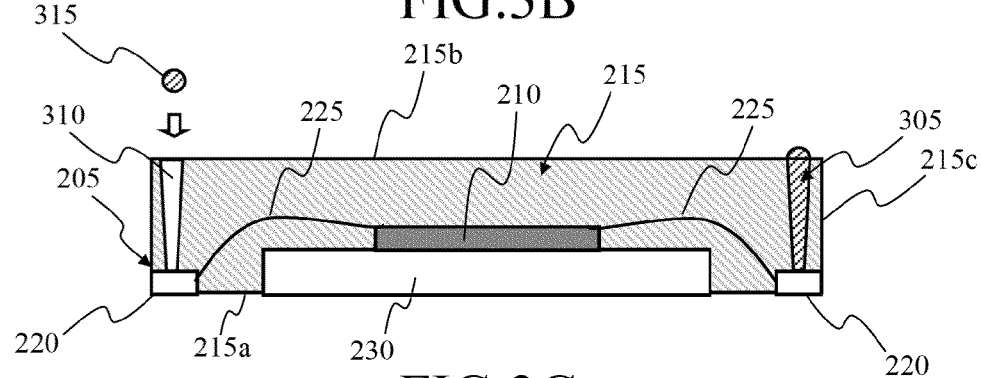

Turning to FIGS. 3B and 3C, is now described a manufacturing process of the electronic assembly 300 according to an embodiment, of which two phases are illustrated in the mentioned figures.

Initially (FIG. 3B), a plurality of holes 310 is made in the insulating casing 215 (operation identified by arrows in the figure), in such a way that each hole 310 extends inside the insulating casing 215 from the second main surface 215b to expose a portion of the corresponding contact element 220 (transversal to the side surfaces 215c). Each hole 310 may be formed in any suitable manner; for example, mechanically with a drilling tool or optically by means of a laser beam.

Next (FIG. 3C), in each hole 310 is introduced an amount of conducting material 315, for example, in the liquid phase, adapted to fill the hole 310 and to form a connection end 305a of the electric connection element 305. For example, the conducting material 315 is, for example, although not exclusively, a welding material adapted to be used in structures with Ball Grid Array or BGA contacts. Each amount of conducting material 315 distributed in the corresponding hole 310 forms (in solid phase) the connection element 305.

The electronic assembly 300 is then obtained in a simple way and with a small number of steps starting from the QFNs device 200.

Figure 3D:
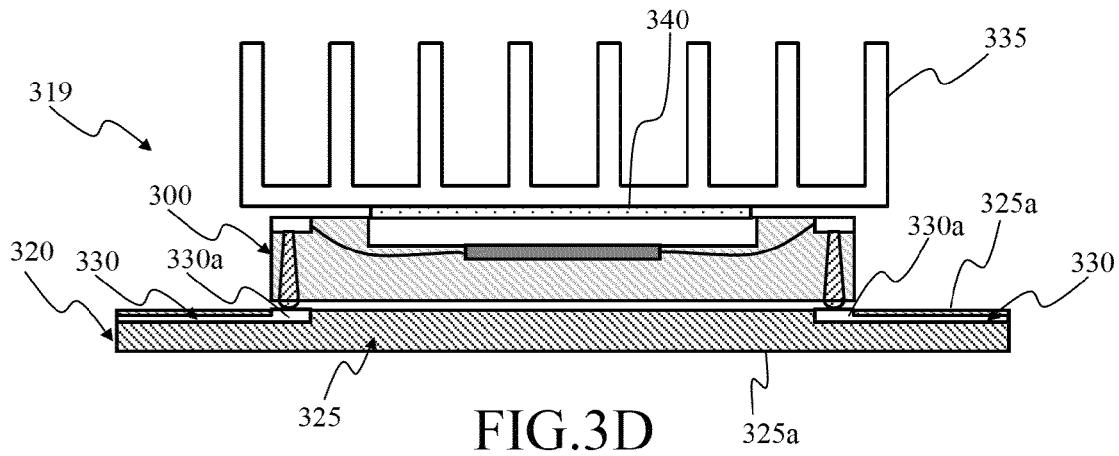

Considering now to FIG. 3D, it is a schematic view in side section of a portion of an electronic circuit 319 comprising the electronic assembly 300 coupled to an electronic board 320 (e.g., a Printed Circuit Board or PCB).

The electronic board 320 includes a body 325 usually made of insulating material (e.g., FR-4) with two main surfaces 325a and 325b, at least one of which is designed for the installation of one or more electronic devices, such as QFNp 100 or QFNs 200 devices—and, in an optional way, also other types of electronic devices (for example, with a different type of surface mounting). The electronic board 320 also includes a plurality of (electric) connection tracks 330 in conducting material (e.g., copper) that are adapted to electrically couple between their contact elements or leads of different electronic devices (to form an electronic circuit). The connection tracks 330 include, for each of their ends, an electric contact region or pad 330a having a suitable footprint, corresponding to a matching contact element 220 or connection end 305a of the connection element 305 of an electronic device mounted thereon.

In an embodiment, the QFNs device 200 is mounted on the electronic board 320 in such a way that each connection end 305a of the connecting member 305 contacts a pad 330a of a corresponding connection track 330, mechanically and electrically coupling the pad 330a with the contact element 220 of the QFNs device 200. The QFNs device 200 can be welded to the electronic board 320 via the known process of reflow welding, during which each connection end 305a melts and bonds to the corresponding contact pad 330a.

The QFNs device 200 is then coupled with the electronic board 320 with the second main surface 215b facing the main surface 325a of the body 325; on the contrary, the first main surface 215a is directed towards the external environment, and then with the dissipation plate 230 (as well as the contact elements 220) freely exposed towards the outside environment.

It should be noted that it is possible to increase the mechanical stability of the coupling between the electronic board 320 and electronic assembly 300 by placing an adhesive layer on the main surface 325a of the electronic board 320 (in a region delimited by the pads 330a covered by the electronic assembly 300) in order to have it bond to the first main surface 115a.

Thanks to the electronic assembly 300 according to the embodiment just described, the dissipation plate 230 is free to dissipate the heat, generated in the chip 210 during operation, directly into the external environment, without the need to couple the dissipation plate 230 to the electronic board 320 or to provide the latter with heat-dissipation elements (for example, thermal via or additional dissipation plates). Moreover, unlike the prior art, the heat generated in the chip 210 is not substantially transferred to the electronic board 320, and both main surfaces of the electronic board 320 can be used for the assembly of electronic devices.

In addition, in order to improve the heat dissipation, it is possible to couple a heat sink element 335 directly to the dissipation plate 230. The coupling between the heat sink element 335 and the dissipation plate 230 may be made by placing a layer of thermal coupling material 340, such as a thermal adhesive paste. Thanks to the electronic assembly configuration with the free dissipation plate 230, it is possible to distribute the layer of thermal coupling material 340 in a uniform manner with ease. It will also be noted that the heat sink element 335 can also be coupled in a second time with the electronic assembly 300 after the mounting of the latter to the electronic board 320.

Alternatively the heat sink element 335 and the electronic assembly 300 may be enclosed in a cover element (not shown, such as a metal shell) in such a way to be protected from the external environment. This cover element is fixed to the electronic board 320 and may also be coupled with the dissipation plate 230 via a layer of a material of thermal coupling to improve the dispersion of the heat generated by the chip 210 within the electronic assembly 300.

Figure 4A:
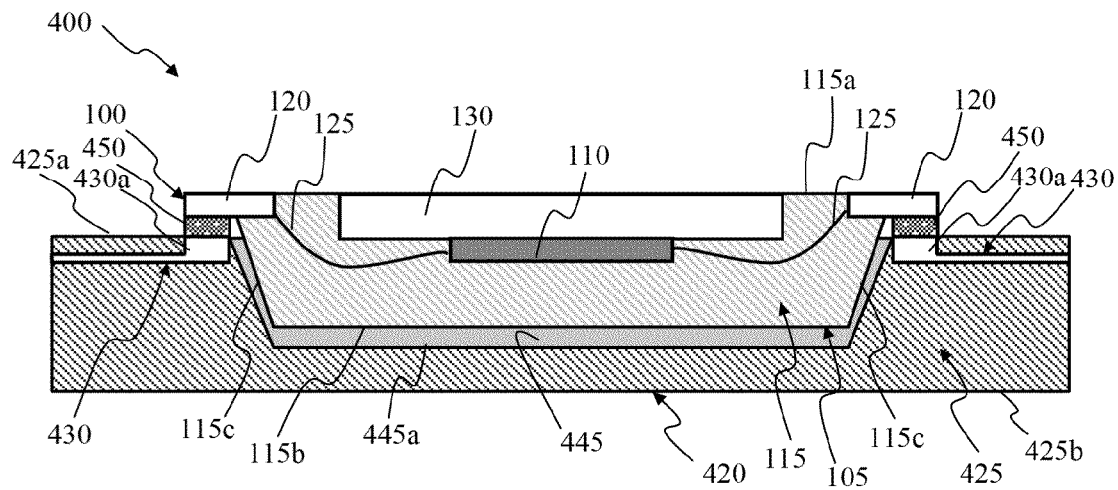
FIGS. 4A-4C are schematic cross-section side views of an electronic assembly including an electronic device of the punched flat-type, of a phase of an assembling method thereof, and of a portion of the electronic circuit including it, respectively, according to an embodiment.

Turning now to FIG. 4A, it is a schematic view in side section of an electronic assembly 400 according to an embodiment, including the QFNp device 100.

The electronic assembly 400 includes substantially the QFNp device 100 coupled with a modified electronic board 420. The modified electronic board 420 differs from the electronic board 320 previously described in what follows. In the electronic board is formed a housing 445 adapted to receive at least partially the QFNp device 100, inserted with the second main surface 115b facing a bottom wall 440a of the housing 445. In particular, the housing 445 is formed between the pads 430a adapted to match with the contact elements 120 of the QFNp device 100. In this way, each contact element 120 may be coupled with the corresponding contact pad 430a (in such a way as to allow the formation of the electronic circuit) through a surface portion of the contact element 120 exposed on the third main surface 115d—adjacent to the side wall 115c and transversal to it (i.e., opposite to the surface portion normally used in the art to make the electrical connection).

Figure 4B:
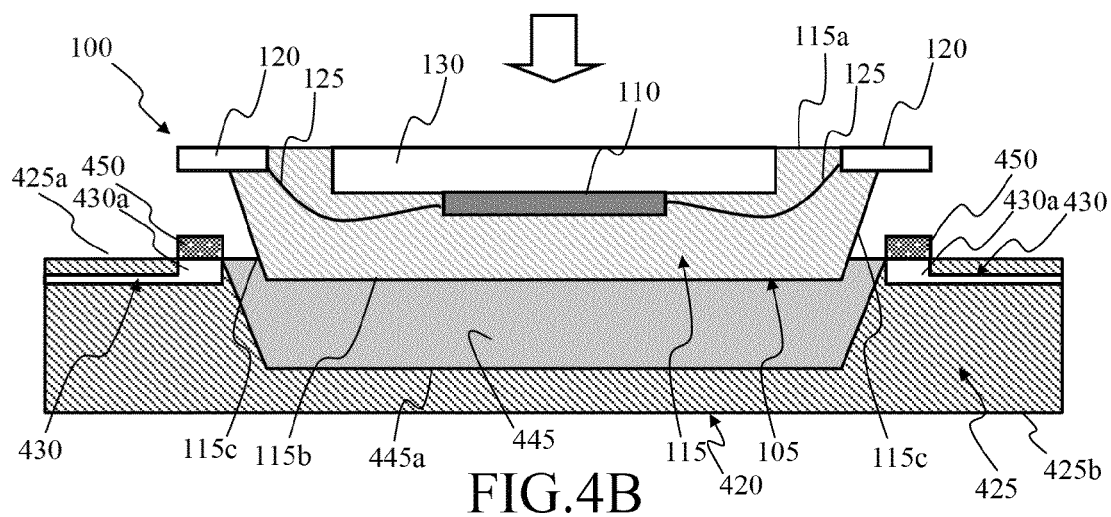

With reference to FIG. 4B, it is now described a manufacturing process of the electronic assembly 400 according to an embodiment, one phase of which is illustrated.

On each pad 430a of the modified electronic board 420 welding material 450 (e.g., a paste for reflow welding) is deposited. Thereafter, the QFNp device 100 is positioned in the housing 445 of the modified electronic board 420, with the contact elements 120 in contact with the welding material 450 previously disposed on the corresponding contact pads 430a. Finally, the electronic assembly 400 is heated up to melt the welding material 450 and then cooled so that it hardens again coupling together both electrically and mechanically the QFNp device 100 and the modified electronic board 420.

In this way, the electronic assembly 400 is completely formed with the first main surface 115a of the QFNp device 100 facing towards the external environment (obtaining the same advantages described above). Furthermore, an extension of the assembly 400 in the direction normal to the main surfaces 115a, 115b and 115d of the QFNp device 100, and to the main surfaces 425a and 425b of the electronic board 420 is reduced with respect to a corresponding footprint obtained by means of a known surface mounting (SMT—Surface Mount Technology).

In addition, it is possible to place an adhesive layer on the bottom wall 445a of the housing 445 in such a way that it bonds to the second main surface 115b in such a way as to increase the mechanical stability of the electronic assembly 400.

In order to obtain an optimal contact between the contact elements 120 and the pads 430a, the former may be formed with a main extension (transversal to the side surface 115c) approximately between 0.1 mm and 0.4 mm, for example, between 0.2 mm and 0.4 mm, such as 0.3 mm.

It is noted that the electronic board 420 may be equipped with a plurality of housings similar to the housing 445 in such a way as to form at the same time a plurality of electronic assemblies similar to the electronic assembly 400 coupling each housing to a corresponding electronic device similar to the QFNp device 100. Such plurality of electronic assemblies that share the same electronic board 420 are part of (or a whole of) a desired electronic circuit.

Figure 4C:
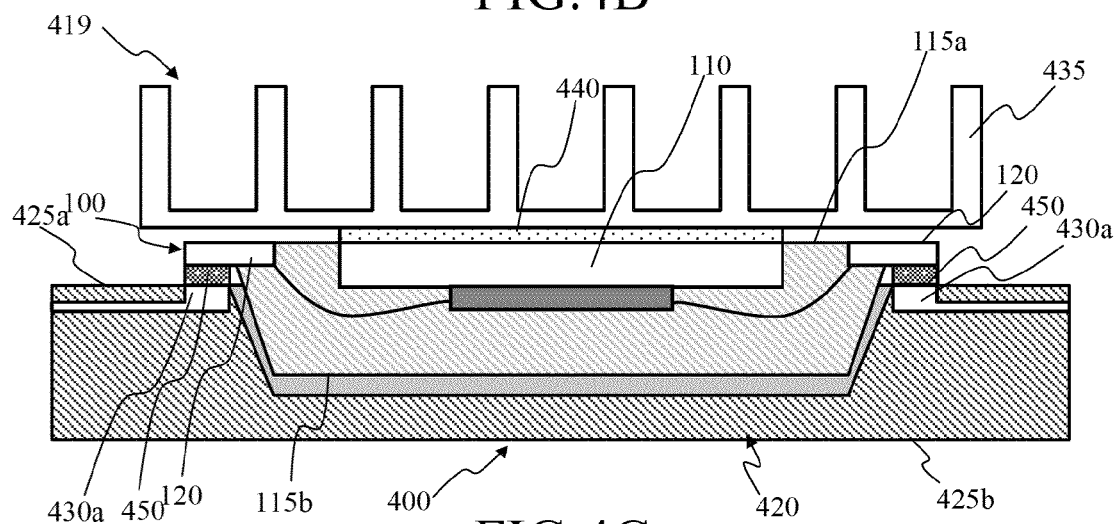

Turning now to FIG. 4C, it is a schematic cross-section side view of a portion of the electronic circuit 419 including the electronic assembly 400 to which a heat sink 435 is applied.

Even in this case, in order to improve the heat dissipation, it is possible to couple a heat dissipating element 435 directly to the dissipation plate 130. The coupling between the heat sink element 435 and the dissipation plate 130 may be made by placing a layer of thermal coupling material 440, such as a thermal paste adhesive (obtaining the same advantages described above). Again as in the previous embodiment, it is possible to have a cover element (not shown) as an alternative to the heat sink 435 to insulate and protect the device QFNp 100 and the housing 445 from the external environment.

Considering now FIG. 5A, it is a schematic cross-section side view of an electronic assembly 500 according to an embodiment, including the QFNs device 200.

In the example at issue, the electronic assembly 500 includes substantially the QFNs device 200 coupled with an (additional) intermediate support element 555. The intermediate support element 555 includes a body 560 of insulating material (e.g., a polymer or a compound material such as FR-4) a substantially punctured parallelepiped shape (i.e., similar to a frame) that defines a housing 545 to house at least partly the QFNs device 200. The body 560 of the intermediate support element 555 includes a first opening 565a formed at a first main surface 560a and a second opening 565b formed in correspondence with its second main surface 560b (opposite to the first one). The second opening 565b is designed with dimensions such as to allow the insertion of the QFNs device 200 within the housing 545. In other words, the intermediate support element 555 is designed to laterally surround the device QFNs 200 around each of the side surfaces 215c. In addition, each portion of the body 560 of the intermediate support element 555 substantially parallel to a side surface 215c has a side cross section substantially "[" shaped (in the operating position shown in FIG. 5A). For example, the intermediate support element 555 is formed in such a way that, when the QFNs device 200 is inserted into the slot 545, the second main surface 215b of the QFNs device 200 is flush with the second main surface 560b of the body 560 of the intermediate support element 555. And, the first main surface of the QFNs device 200, or at least the dissipation plate 230, is exposed from the electronic assembly 500 through the first opening 565a (although recessed with respect to the main surface 560a of the body 560).

Inside the body 560 of the intermediate support element 555 a plurality of intermediate connection elements 570 of conducting material (e.g., a metal such as copper) is formed. Each intermediate connection element 570 includes a first connection end 570a, which is exposed on an inner surface 560c facing the housing 545 of a portion of the body 560 parallel to the first surface 515a of the housing 545. With this arrangement, the first connection end 570a of each intermediate connection element 570 may be electrically and mechanically coupled with a corresponding contact element 220 of the electronic QFNs device 200 (when the latter is inserted into the housing 545) thanks to welding intermediate material 575 (for example, suitable for reflow welding). A second connection end 570b faces the second main surface 560b of the body 560 (i.e., in the same direction of the second main surface 215b of the casing 215).

Turning to FIG. 5B, a manufacturing process of the electronic assembly 500 is now described, a phase of which is illustrated in the figure.

In order to facilitate insertion of the QFNs device 200 within the housing 545 of the intermediate support element 555, the latter is disposed with the first main surface 560a facing towards (or in contact with) a supporting surface (not shown, for example a transport chain in an automated manufacturing facility); therefore, with the second main surface 560b, and the second opening 565b free (i.e., turned towards the external environment). Thanks to this positioning of the intermediate support element 555 it is possible to reach every first connection end 570a and depositing a controlled amount of welding material 575 on each one thereof.

Subsequently, the QFNs device 200 is inserted (action shown schematically by an arrow in FIG. 5B) from its first main surface 215a in such a way that each contact element 220 matches with the respective first connection end 570a via the intermediate welding material 575.

Finally, the welding material 575 is brought to a melting temperature and then cooled in such a way that it permanently couples electrically and mechanically the electronic QFNs device 200 and the intermediate support element 555 once hardened again.

At this point the electronic assembly 500 is completely formed (and adapted to be distributed to any third party).

Considering now to FIG. 5C, it is a schematic cross section side view of a portion of an electronic circuit 519 including the electronic assembly 500 and an electronic board 520.

The electronic board 520 is substantially similar to the electronic board 320 previously described, but in which the pads 530a of the connection tracks 530 are arranged in such a way as to match to a respective second connection end 570b of the intermediate support element 500.

In an embodiment, the assembly is mounted on the electronic board 520 so that each second connection end 570b of the connection elements 570 contacts a pad 530a of a corresponding connection track 530, electrically and mechanically coupling the connection track 530 with the electronic assembly 500; in particular, each contact element 220 of the QFNs device 200 (and therefore the corresponding terminal of the chip 210) is electrically coupled to a corresponding connection track 530. The electronic assembly 500 may be welded to the electronic board 520 with a reflow soldering process.

The electronic assembly 500 is then coupled with the electronic board 520. In particular, the QFNs device 200 is disposed with the second main surface 215b facing the main surface 525a of the body 525; on the contrary, the first main surface 215a faces towards the external environment, thus with the dissipation plate 230 freely exposed to the external environment (as well as the contact elements 220).

It is noted that it is possible to increase the mechanical stability of the coupling between the electronic board 520 and of the electronic assembly 500 by placing an adhesive layer on the main surface 525a of the electronic board 520 (in a region delimited by the pads 530a covered by the electronic assembly 500) in order to have it bind to the first main surface 215a.

In addition, in order to improve the heat dissipation, it is possible to couple a heat dissipating element 535 to the dissipation plate 230.

In the embodiment at issue, an additional heat sink element 580 is coupled with the dissipation plate 230, for example by placing a layer of thermal coupling material 540, such as a thermal adhesive paste. The additional heat sink element 580 is designed in such a way that it protrudes from (or flushes with) the first opening 565a on the first main surface 560a of the intermediate support element 555. The heat sink element 535 can be coupled with the additional heat sink 580 through another layer of thermal coupling material (not shown in FIG. 5C for simplicity). Alternatively, it may be provided a different heat sink element (not shown), substantially corresponding to the union heat sink element 535 and the additional heat sink element 580 (i.e., with the two heat sink elements 535 and 580 integrally formed therewith).

Alternatively to the heat sink element 535 and alternatively, or in addition, to the additional sink element 580, the electronic assembly 500 may be enclosed in a cover element (not shown, for example a metal shell as in the case above) to be protected from the external environment. The covering element may be coupled with the dissipation plate 230 or to the additional heat sink element 580 (for example, again using a thermally conductive adhesive paste).

It is noted that the intermediate support element 555 may be used as additional support for supporting the heat sink element 535 (or the cover element) binding it thereto via a mechanical coupling element (for example an adhesive paste) or, simply, by placing the heat sink 535 on the main surface 560a of the body 560.

Figure 6A:
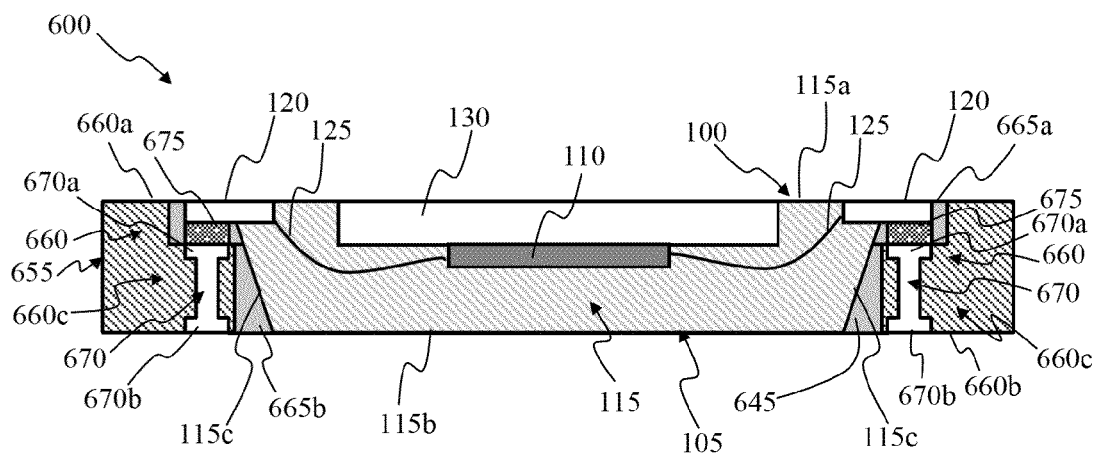
FIGS. 6A-6C are schematic cross-section side views of an electronic assembly including an electronic device of the punched flat type, a phase of an assembling method thereof, and of a portion of the electronic circuit including it, respectively, according to an embodiment.

Considering now to FIG. 6A, it is a schematic cross-section side view an electronic assembly 600 according to an embodiment, including the QFNp device 100.

The electronic assembly 600 is similar to the electronic assembly 500, from which it differs in the following. The electronic assembly 600 includes substantially the QFNp device 100 coupled with an intermediate support element 655, with the latter that houses the former within a housing 645. In addition, each portion of the body 660 of the intermediate support element 655 substantially parallel to a side surface 115c has a side cross section substantially "L" shaped (in the operating position shown in FIG. 6A). For example, the intermediate support element 655 is formed in such a way that, when the QFNp device 100 is inserted into the housing 645, the second main surface 115b of the QFNp device 100 is flush with the second main surface 660b of the body 660 of the intermediate support element 655. Conversely, the first main surface 115a of the QFNp device 100, or at least the dissipation plate 130, is exposed from the electronic assembly 600 through the first opening 656b (although maybe slightly recessed with respect to the main surface 660a of the body 660).

Also in this case there is provided a plurality of intermediate connection elements 670 in conducting material, each with a first connection end 670a exposed on an inner surface 660c facing the housing 645 at a position corresponding to a respective contact element 120. Each first connection end 670a is coupled electrically and mechanically to a corresponding contact element 120 of the electronic QFNp device 100, thanks to a respective amount of intermediate welding material 675 interposed therebetween. The second connection end 670b is exposed on the second main surface 660b of the body 660.

Figure 6B:
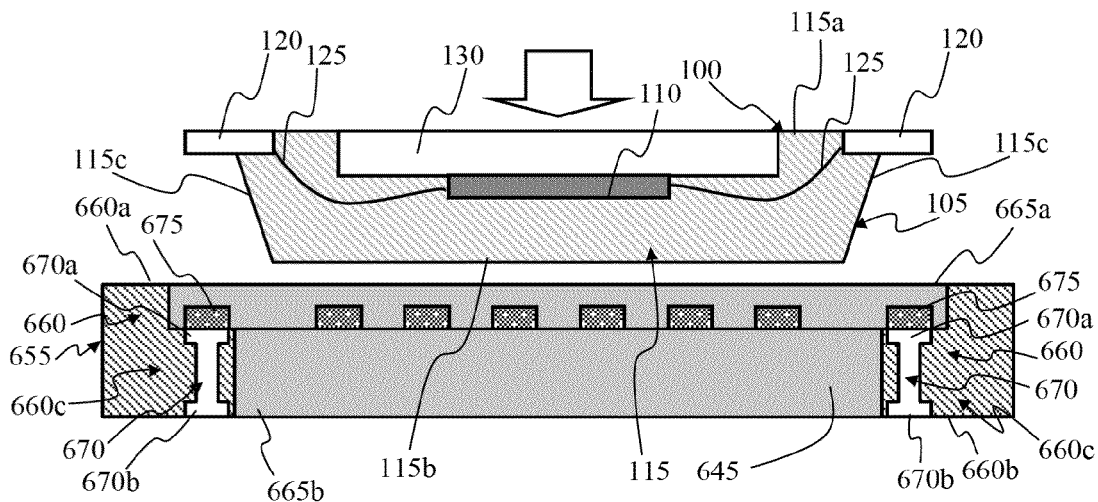

Turning to FIG. 6B, a manufacturing process of the electronic assembly 600 is now described, a phase of which is illustrated in the figure.

The QFNp device 100 is inserted within the housing 645 of the intermediate support element 655, the latter is disposed in the operating position, with the second main surface 660b facing (or in contact with) a supporting plane (not shown, for example a transport chain in an automated manufacturing facility), while the first main surface 660a, and the first opening 665b are left free (i.e., turned towards the external environment). A respective amount of intermediate welding material 675 is disposed on each first connection end 670a.

Subsequently, the QFNp device 100 is inserted (action shown schematically by an arrow in FIG. 6B) in the housing 645 through the first opening 665b starting from its second main surface 115b in such a way that each contact element 120 matches to the first connection end 670a via the intermediate welding material 675 through a surface of the contact element 120 adjacent to the respective side surface 115c.

Finally, the intermediate welding material 675 is brought to a melting temperature and then cooled in such a way as to electrically and mechanically couple the electronic QFNp device 100 and the intermediate support element 655 once hardened again. At this point the electronic assembly 600 is fully formed (and adapted to be distributed to any third party).

Figure 6C:
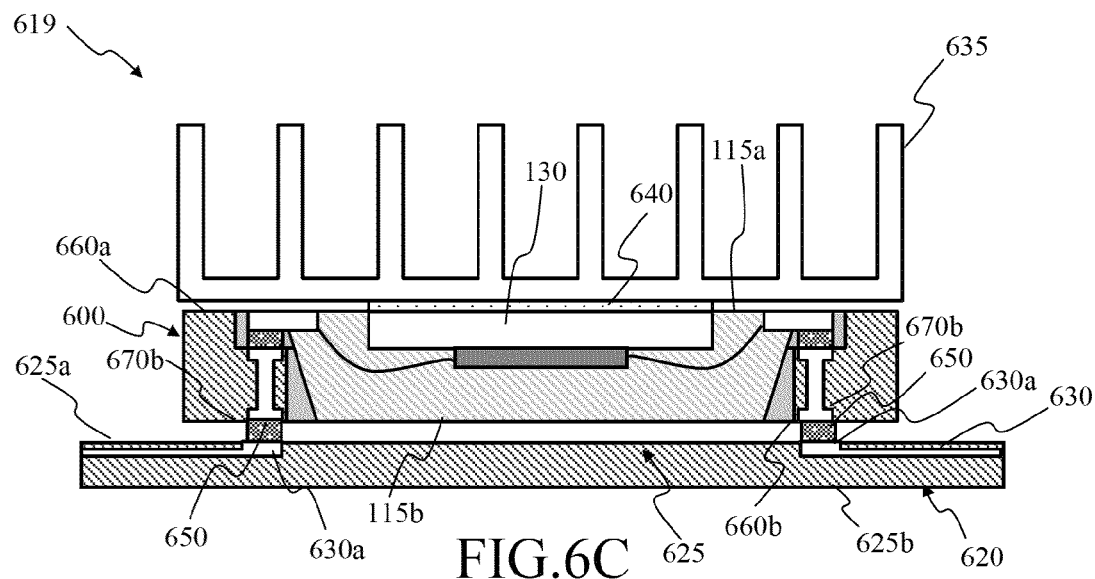

Considering now FIG. 6C, it is a schematic cross-section side view of a portion of an electronic circuit 619 including the electronic assembly 600 and an electronic board 620.

The electronic board 620 is substantially similar to the electronic board 320 previously described, with a pad 330a having a footprint adapted to correspond to a matching contact element 220 or connection end 305a of the connection element 305 of an electronic device mounted thereon.

In an embodiment, the assembly is mounted on the electronic board 620 in such a way that each second connection end 670b of the connection element 670 contacts a pad 630a of a corresponding connection track 630, electrically and mechanically coupling the connection track 630 with the electronic assembly 600; in particular, each contact element 120 of the QFNp device 100 is electrically coupled to a corresponding connection track 630. The electronic assembly 600 may be welded to the electronic board 620 by means of the reflow welding process.

The electronic assembly 600 is then coupled with the electronic board 620. In particular, the QFNp device 100 is positioned with the second main surface 115b facing the main surface 625a of the body 625; on the contrary, the first main surface 115a is facing towards the external environment, and then with the dissipation plate 130 (as well as the contact elements 120) freely exposed to the external environment.

It is noted that it is possible to increase the mechanical stability of the coupling between the electronic board 620 and electronic assembly 600 by placing an adhesive layer on the main surface 625a of the electronic board 620 (in a region delimited by the pads 630a covered by the electronic assembly 600) in order to have it bonded to the first main surface 115b.

In addition, in order to improve the heat dissipation, it is possible to couple a heat sink element 635 to the dissipation plate 630 (in a similar way as previously described for the other embodiments). Alternatively to the heat sink element 635, in this case also it is possible to provide a cover element coupled to the electronic board 620 and to the electronic assembly 600 in such a way as to protect the latter.

It is noted that the intermediate support element 655 might be advantageously used as additional support for supporting the heat sink element 635 (or the cover element).

Figure 7A:
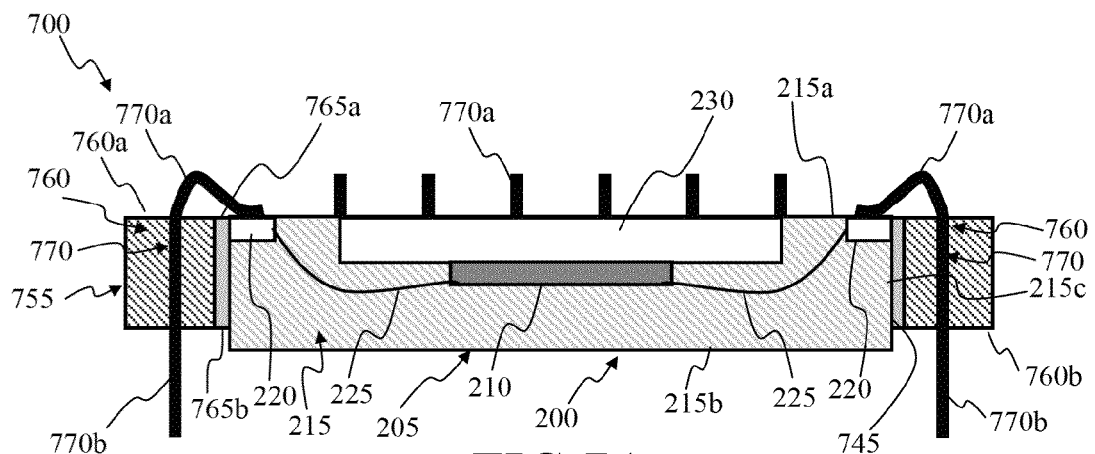
FIGS. 7A-7C are schematic cross-section side views of an electronic assembly adapted to a through-hole mount, of a step of an assembling method thereof, and of a portion of the electronic circuit including it, respectively, according to an embodiment.

Turning to FIG. 7A, is now described an electronic assembly 700 adapted to through-holes mounting, according to an embodiment, of which a schematic cross-section side view is represented in the figure.

In the example at issue, the electronic assembly 700 includes substantially the QFNs device 200 coupled with an intermediate support element 755. The intermediate support element 755 includes a body 760 in insulating material (e.g., a polymer or a compound material such as FR-4) having a substantially punched parallelepiped shape so as to define a housing 745 to house at least partly the QFNs device 200. The body 760 includes a first opening 765a formed at a first main surface 760a and a second opening 765b formed in correspondence with its second main surface 760b (opposite to the first one). The openings 765b are designed with such a size as to allow the insertion of the QFNs device 200 within the housing 745. In other words, the intermediate support element 755 (in operating position) laterally surrounds the QFNs device 200 around each one of the side surfaces 215c.

The intermediate support element 755 includes a clip connection element 770 for each one of the contact elements 220 of the electronic device 200. The clip connection elements 770 are made in conducting material (e.g., a metal such as copper), each of which is formed in the body 760 at a position corresponding to a respective contact element 220. Each intermediate connection element 770 includes a clip connection end 770a that is exposed on its first main surface 760a, while an insertion connection end 770b protrudes from the second main surface 760b. With this arrangement the clip connection end 770a of each intermediate connection element 770 may be electrically and mechanically coupled with a corresponding contact element 220 of the electronic QFNs device 200 via a direct contact. Conversely, the insertion connection end 770b is adapted to be inserted into through holes of an electronic board 720 (shown in FIG. 7B and 7C).

Figure 7B:
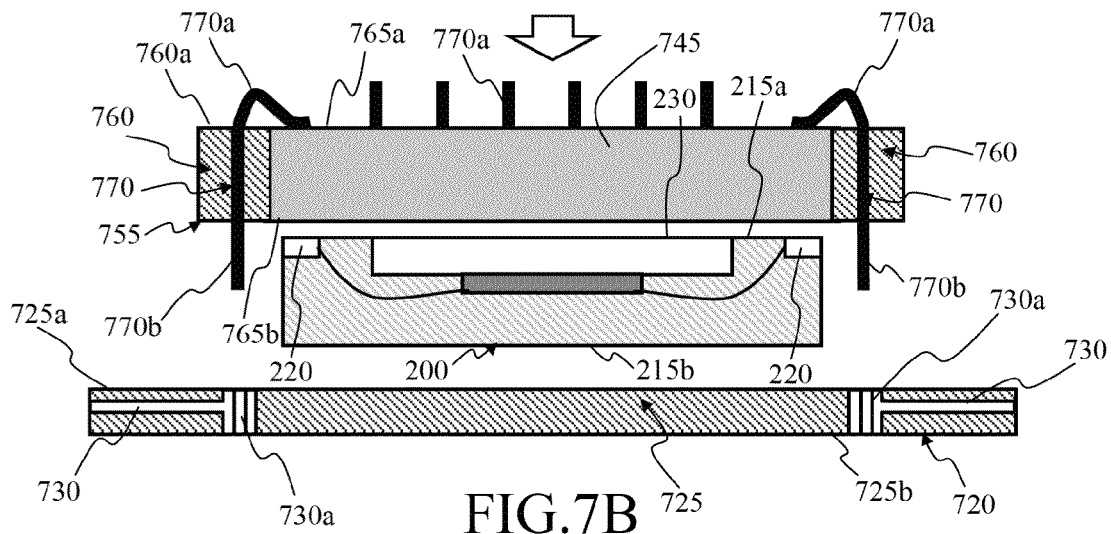

FIG. 7B is a schematic cross-section side view of an assembling phase of the electronic assembly 700.

The assembly of the electronic assembly 700 differs from that of the electronic assemblies previously described in the fact that the assembly of the support element 755 and of the QFNs device 200 is, for example, carried out contextually with the mounting of the electronic assembly 700 to the corresponding electronic board 730.

The QFNs device 200 is positioned with the second main surface 215b in contact with the first main surface 725a of the PCB 720, in such a way as to be surrounded (along a perimeter of its second main surface 215b) by a plurality of conducting through holes 730a. Alternatively, an adhesive element can be interposed between the surfaces 725a and 215b for improving a mechanical coupling between the QFNs device 200 and the electronic board 730.

Subsequently, the support element 755 is coupled with the QFNs device 200. The insertion connection ends 770b of the support elements 755 are each one inserted in a respective conducting through hole 730a; in this way, the support element 755 surrounds the QFNs device 200 and the clip connection ends 770a contact each one the corresponding contact element 220 of the QFNs device 200.

Finally, the insertion connection ends 770b are welded to the conduction track 730 after their insertion into the conducting through holes 730a (for example, by means of the known wave soldering process). The intermediate support element 755 is sized in such a way that, once bonded to the electronic board 720, the clip connection ends 770a press (thanks to their shape and the elasticity of the material used in their construction) towards the electronic board 720 the QFNs device 200, thanks to this the QFNs device 200 and the support element 755 are associated with each other both mechanically and electrically, and the resulting electronic assembly 700 is firmly (again both electrically and mechanically) bonded to the electronic board 720.

Figure 7C:
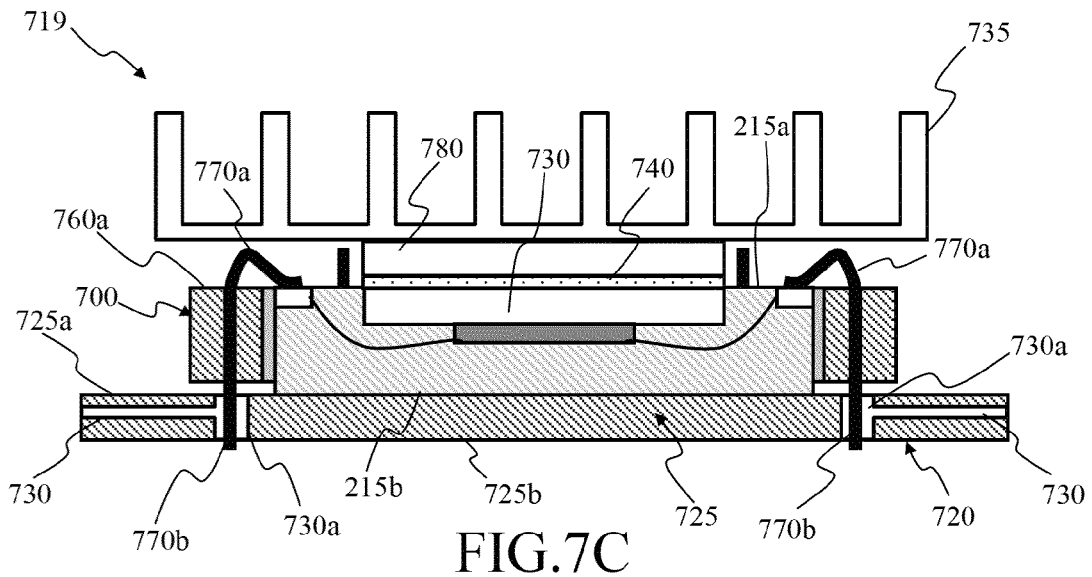

Turning to FIG. 7C, it is a schematic cross-section side view of a portion of the electronic circuit 719 including the electronic assembly 700 and the electronic board 720.

The electronic assembly 700 is bonded to the electronic board 720 during its assembly. In addition, in order to improve the dispersion of heat, it is possible to couple a heat sink element 735 to the dissipation plate 230. It is possible to couple an additional heat sink element 780 to the dissipation plate 230 to prevent that the heat sink element 735 comes into contact with the clip ends 770a—avoiding short circuit episodes between them or a compression thereof able to compromise the electrical/mechanical contact with the contact elements 220. The additional heat sink element 780 is designed in such a way that it protrudes over a portion of the clip connection ends 770a farthest from the main surface 725a of the electronic board 720. The heat sink element 735 may be coupled with the additional heat sink 780 through another layer of thermal coupling material (not shown in FIG. 7C). Alternatively, a different heat sink element (not shown) may be provided substantially corresponding to the union heat sink element 735 and of the additional heat sink element 780 (i.e., the two heat sink elements 735 and 780 are formed integral to one another).

Thanks to the electronic assembly 700 it is possible to couple the QFNs device 200 to the electronic board 720 with the dissipation plate 230 facing towards the external environment (i.e., opposite to the electronic board 720). In addition, the electronic assembly 700 allows associating the QFNs device 200 to the electronic board 720 adapted to through-holes mounting even if the QFNs device 200 is designed for surface mounting.

It is noted that the various embodiments described including QFNp devices 100 may be adapted for the use with QFNs devices 200 and, similarly, the various described embodiments including QFNs devices 200 can be adapted for use with devices QFNp 100. In addition, the various embodiments described above may be combined together without departing from the scope of the present disclosure.

For example, the integrated-circuit chips 110 and 210 may include one or more computing circuits such as a microprocessor or a microcontroller. Furthermore, the chips 110 and 210 may include other integrated circuits coupled to the one or more computing circuits. Or, one or more other chips may be mounted to the board (e.g., the board 520 in FIG. 5C), and one or more of these chips may include one or more other integrated circuits that are coupled to the integrated circuit(s) on the chip 110 or on the chip 210.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated-circuit assembly, comprising:
   a package including a first side, a second side opposite to the first side, and a third side disposed between the first and second sides, a conductive contact element disposed along the first side, and a heat dissipater disposed along the first side;
   an integrated-circuit chip disposed in the package, the integrated-circuit chip being thermally coupled to the heat dissipater, and the integrated-circuit chip having a conductive contact pad electrically coupled to the contact element;
   a conductor having a first end electrically coupled to the contact element, extending along the third side of the package, and having a second end that is accessible from the second side of the package;
   a support element having an opening;
   wherein the package is disposed in the opening; and
   wherein the conductor is disposed in the support element.

2. The integrated-circuit assembly of claim 1 wherein the third side of the package is substantially perpendicular to the first and second sides of the package.

3. The integrated-circuit assembly of claim 1 wherein the third side of the package forms an acute angle or an obtuse angle with one of the first and second sides of the package.

4. The integrated-circuit assembly of claim 1 wherein the package includes an insulating casing in which the contact element and heat dissipater are disposed.

5. The integrated-circuit assembly of claim 1 wherein the contact element is also disposed along the third side of the package.

6. The integrated-circuit assembly of claim 1 wherein the heat dissipater includes a thermally conductive plate.

7. The integrated-circuit assembly of claim 1, further comprising a bonding wire disposed in the package and having a first end coupled to the contact element and having a second end coupled to the contact pad.

8. The integrated-circuit assembly of claim 1 wherein the conductor is disposed in the package and extends from the contact element to the second surface of the package.

9. The integrated-circuit assembly of claim 1 wherein the first end of the conductor is coupled to a portion of the contact element that faces away from the second side of the package.

10. The integrated-circuit assembly of claim 1 wherein the first end of the conductor is coupled to a portion of the contact element that faces toward the second side of the package.

11. The integrated-circuit assembly of claim 1, further comprising a heat-sink disposed over, and thermally coupled to, the heat dissipater.

12. An electronic assembly, comprising:
   a circuit board including a conductive trace and a conductive contact region electrically coupled to the trace, the circuit board having a recess; and
   an integrated-circuit assembly mounted to the circuit board in the recess of the circuit board, the integrated-circuit assembly including a first side facing away from the board and a second side facing the board, a conductive contact element disposed along the first side and electrically coupled to the contact region, a heat dissipater disposed along the first side, and an integrated-circuit chip that is thermally coupled to the heat dissipater and the integrated-circuit chip having a conductive contact pad that is electrically coupled to the contact element.

13. The electronic assembly of claim 12 wherein:
   the integrated-circuit assembly includes an edge disposed between the first and second sides; and
   the contact element has a portion that extends beyond the edge and over the contact region.

14. The electronic assembly of claim 12 wherein the integrated-circuit assembly includes a conductor having a first end electrically coupled to the contact element and having a second end electrically coupled to the contact region.

15. The electronic assembly of claim 12 wherein:
   the circuit board includes an opening; and
   the integrated-circuit assembly is disposed in the opening.

16. The electronic assembly of claim 12, further comprising:
   a first integrated circuit disposed on the integrated-circuit chip; and
   a second integrated circuit coupled to the first integrated circuit, one of the first and second integrated circuits including a computing circuit.

17. A method, comprising:
   orienting an integrated-circuit assembly such that a front side of the assembly faces away from a circuit board including a conductive contact region, and such that a back side of the assembly faces toward the board, the front side including a heat dissipater and a conductive contact element;
   mounting the integrated-circuit assembly to the board such that the back side faces the board and such that the contact element is electrically coupled to the contact region; and
   wherein mounting the integrated-circuit assembly includes mounting the assembly in a recess of the board.

18. A method, comprising:
   forming a coupling structure for an integrated-circuit assembly to a circuit board, the integrated-circuit assembly including a first side, a second side opposite to the first side and facing the circuit board, a conductive contact element disposed along the first side, a heat dissipater disposed along the first side, and an integrated-circuit chip that is thermally coupled to the heat dissipater and the integrated-circuit chip having a conductive contact pad that is electrically coupled to the contact element;
   forming as part of the coupling structure a conductor having a first end electrically coupled to the contact element and having a second end that is accessible from the second side of the assembly for coupling to a contact region of the circuit board;
   forming an opening in the circuit board; and
   disposing the integrated circuit assembly in the opening.

* * * * *